United States Patent [19]
Gn et al.

[11] Patent Number: 5,677,238
[45] Date of Patent: Oct. 14, 1997

[54] SEMICONDUCTOR CONTACT METALLIZATION

[75] Inventors: Fang Hong Gn; Sekar Ramamoorthy; Lap Chan; Che-Chia Wei, all of Singapore, Singapore

[73] Assignee: Chartered Semiconductor Manufacturing PTE LTD, Singapore, Singapore

[21] Appl. No.: 638,667

[22] Filed: Apr. 29, 1996

[51] Int. Cl.$^6$ ............................................. H01L 21/283
[52] U.S. Cl. ........................ 437/194; 437/192; 437/190
[58] Field of Search ............................. 437/194, 192, 437/190, 203, 195

[56] References Cited

U.S. PATENT DOCUMENTS 5,240,880  8/1993  Hindman et al. ...................... 437/190
5,356,836  10/1994  Chen et al. ........................... 437/194
5,374,592  12/1994  MacNaughton et al. ............... 437/194

OTHER PUBLICATIONS

R.C. Ellwanger, et al. "An Integrated Aluminum/CVD-W Metallization Process . . . " Proc. 8th International IEEE VLSI Multilevel Interconnect. Conf. (Jun. 1991).

*Primary Examiner*—John Niebling
*Assistant Examiner*—C. Everhart
*Attorney, Agent, or Firm*—George O. Saile

[57] ABSTRACT

A method for fabricating an improved connection between active device regions in silicon, to an overlying metallization level, has been developed. The method produces contacts with superior and improved barrier integrity, which permits silicon device exposure to extended thermal process times and/or higher temperature processes without metal penetration into the silicon contact junction regions. The critical element is the addition of a conformal CVD tungsten layer in the multilayer barrier structure.

12 Claims, 1 Drawing Sheet ns 5,677,238

SEMICONDUCTOR CONTACT METALLIZATION

BACKGROUND OF THE INVENTION

(1) Field of the Invention

This invention relates to a method of fabrication used for semiconductor integrated circuit devices, and more particularly, to a method which produces a metallization with superior and improved barrier integrity for contact between active silicon device regions and overlying metal conducting lines.

(2) Description of Related Art

In the fabrication of semiconductor integrated circuits, metal layers make contact to lower active silicon device regions of the integrated circuit through vias in an insulating layer. Due to shrinkage in size of semiconductor components and increased circuit density the need arises to obtain contacts having surfaces of very small area and spaced at very small intervals. In order to achieve the necessary small spacing intervals the vias etched through the insulating layer must have nearly vertical sidewalls and dry etching processes such as plasma etching and RIE (Reactive Ion Etching) have been developed to produce such vertical sidewall vias. After formation of the vertical sidewall vias, the subsequent metal deposition processes must be capable of filling the vias with a conducting metallization which is without voids within the via and which produce a substantially planar conducting layer across the via regions and insulator regions. This conducting metallization must also produce a low resistance contact to active silicon device regions and must provide a barrier to penetration of components of the metallization into the silicon in the active device contact regions.

U.S. Pat. No. 5,240,880 entitled "Ti/TiN/Ti Contact Metallization" granted Aug. 31, 1993 to Gregory Hindman et al describes a method of forming a Ti/TiN/Ti contact metallization to a doped silicon region, wherein titanium is first sputtered from a titanium target, then titanium nitride is deposited by introducing nitrogen into the sputtering chamber while sputtering from the titanium target, and finally stopping the supply of nitrogen gas so that the final sputtered layer is titanium. Subsequently aluminum is deposited on top of the titanium layer and heat is applied so that some of the titanium in the first titanium layer reacts with the silicon in the doped silicon region to form a silicide layer.

U.S. Pat. No. 5,356,836 entitled "Aluminum Plug Process" granted Oct. 18, 1994 to Kuang-Chao Chen et al describes a metallization scheme wherein the barrier layer is made up of sputtered multilayers having a first layer composed of titanium, a second layer composed of either titanium nitride or titanium tungsten, and a final layer composed of titanium. Subsequently aluminum is deposited by a two step sputtering process wherein the first step is performed cold to insure continuity of film coverage and the second step is performed hot to prevent void formation within the contact region.

In the aforementioned processes the effectiveness of the barrier properties of the sputtered multilayers is degraded when the aspect ratio of contact holes is high, because sputtering processes provide poor coverage at the bottom corners of deep vertical holes. Aspect ratio is defined as the ratio of hole depth to hole width. As circuit device dimensions shrink contacts having a width of 5,000 Angstroms or less become necessary. With interlevel dielectric layer thicknesses ranging between about 5,000 to 10,000 Angstroms the contact hole aspect ratio is greater than 1.0. In addition, high aspect ratio contact holes require that the sputtered aluminum metallization be deposited with an extended and/ or hotter second deposition step in order to produce a voidless contact and a planar metallization surface. This higher temperature and/or longer time at a high temperature, also, degrade the barrier integrity and result in aluminum penetration into the silicon contact region to cause shorting of the doped silicon junction.

The present invention is directed to a novel and improved method of forming contact metallization to active silicon device regions, wherein the contact metallization has superior and improved barrier integrity.

SUMMARY OF THE INVENTION

One object of the present invention is to provide an improved method of forming a contact metallization to a doped silicon region on a silicon substrate.

Another object of the present invention is to provide a new and improved multilevel contact metallization with superior and improved barrier integrity for contact between active silicon device regions and overlying metal conducting lines.

A further object of the present invention is to provide a new and improved multilevel contact metallization which permits silicon device exposure to extended thermal process times and/or higher temperature processes without metal penetration into the silicon contact junction regions.

In accordance with the present invention, the above and other objectives are realized by using a method of forming a contact metallization to a doped silicon region on a silicon wafer through an interlevel dielectric layer. This method comprises forming a contact hole in the interlevel dielectric layer; thereafter, depositing a first titanium layer over the surface of the interlevel dielectric and into the contact hole; thereafter, depositing a titanium nitride layer over the titanium layer; thereafter, depositing a layer of CVD (Chemical Vapor Deposited) tungsten over the titanium nitride layer; thereafter, depositing an optional second titanium layer over the CVD tungsten layer; thereafter, depositing aluminum or an aluminum-copper-silicon alloy by a two step sputtering process wherein the first step is performed cold to insure continuity of film coverage and the second step is performed hot to fill and planarize the contact region.

BRIEF DESCRIPTION OF THE DRAWINGS

The object and other advantages of this invention are best described in the preferred embodiments with reference to the attached drawings that include.

DESCRIPTION OF THE PREFERRED EMBODIMENTS

The new and improved method of forming contact metallization to active silicon device regions, wherein the contact metallization has superior and improved barrier integrity, will now be described in detail This contact metallization can be used as part of MOSFET devices that are currently being manufactured in industry; therefore only the specific areas unique to understanding this invention will be described in detail.

Figure 1:
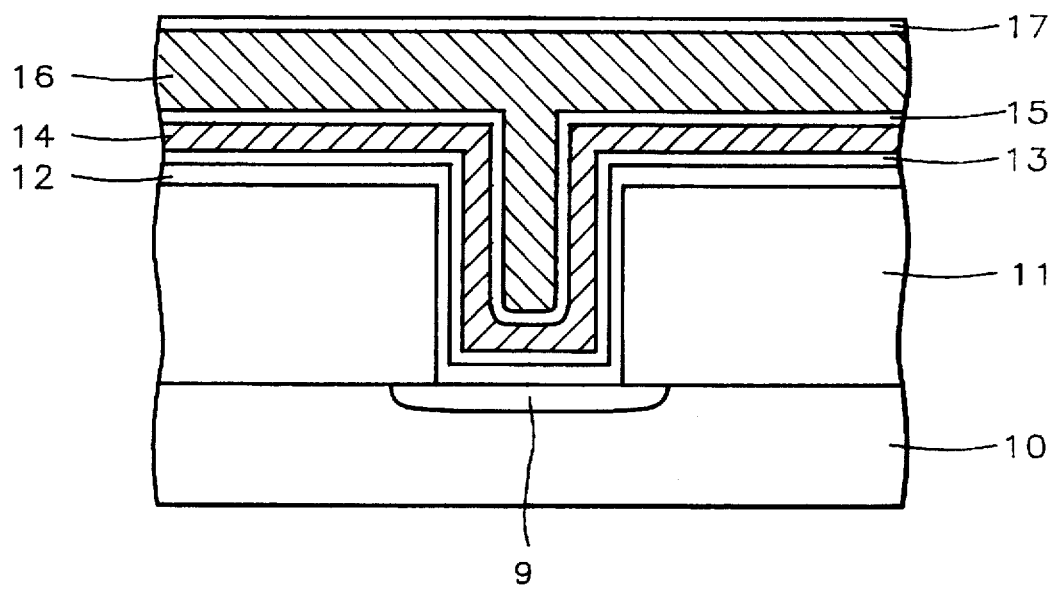
FIGS. 1 and 2, which schematically, in cross-sectional representation, illustrate one preferred embodiment of this invention.

Referring to FIG. 1, there is shown a portion of a partially completed integrated circuit. The semiconductor substrate, 10, is preferably composed of P-type, single crystal silicon with a <100> orientation. A doped region, 9, is provided in the semiconductor substrate, 10. An interlevel dielectric layer, 11, of silicon dioxide or the like, is deposited by low pressure chemical vapor deposition (LPCVD), atmospheric pressure chemical vapor deposition (APCVD), or plasma-enhanced chemical vapor deposition (PECVD) to a thickness of between about 5,000 to 15,000 Angstroms.

Contact openings are formed through the interlevel dielectric layer to the semiconductor substrate, 10, wherein there may be doped device region, 9, formed therein, as is well understood by those skilled in the art. Conventional lithography and dry etching techniques, such as plasma etching or RIE, are used to form the contact openings. For simplicity, and since they do not form a part of the invention, a single opening and a single doped device region are shown in the Figs.

Figure 2:
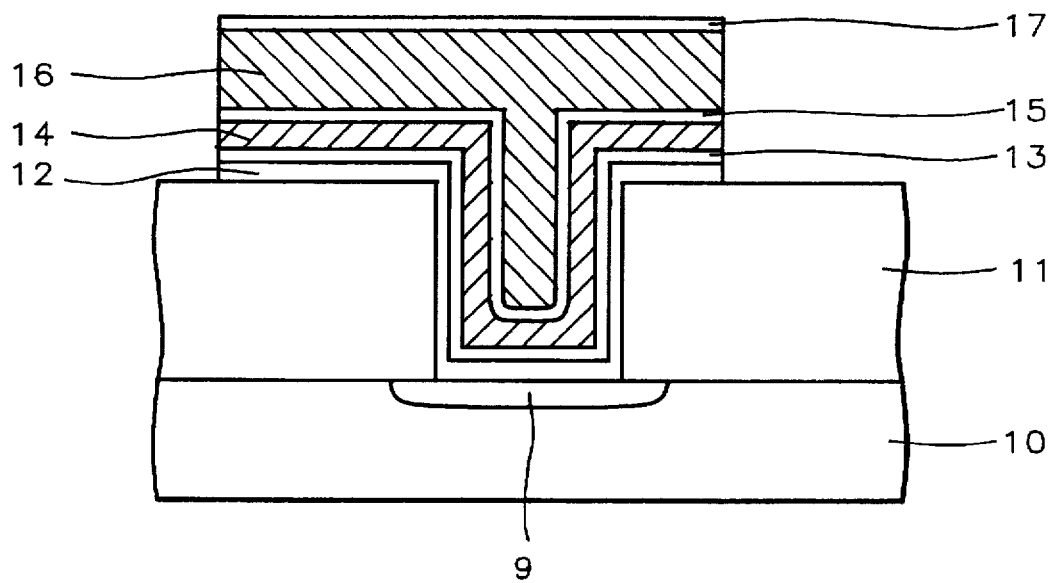

Referring again to FIG. 1, a multilevel barrier layer is deposited over the surface of the substrate and within the contact openings. The first layer, 12, is composed of sputtered titanium and is between about 400 to 800 Angstroms thick. The titanium in contact with the silicon within the contact openings reacts with the silicon, upon subsequent heating, to form a low resistance contact. The second layer, 13, is composed of titanium nitride, deposited by sputtering from a titanium target in the presence of nitrogen, and is between about 800 to 1,500 Angstroms thick. A third and critical layer, 14, for this invention, is composed of conformal CVD tungsten deposited by using $WF_6$, $SiH_4$ and $H_2$ at a pressure between about 60 to 120 Torr, at a temperature between about 350° to 480° C., and is between about 800 to 2,500 Angstroms thick. An important attribute of conformal CVD tungsten layer, 14, is formation of a continuous layer over the titanium nitride layer, 13, on all surfaces, including the bottom of the contact opening, the vertical sidewalls of the contact opening, and surfaces outside the contact regions and across corners and intersections of the various titanium nitride surfaces. The conformality of the CVD tungsten layer, 14, improves the integrity of the barrier layer by eliminating easy diffusion paths for silicon and aluminum at contact corners. A final optional layer, 15, completing the barrier layer, is composed of sputtered titanium and is between about 400 to 800 Angstroms thick. The sputtered titanium layer, 15, serves as an adhesive layer between the barrier layers and subsequently sputtered aluminum-copper-silicon metallization layer, 16. The preferred metallization is aluminum or an aluminum alloy, such as Al-1% Si-0.5% Cu, or alternately alloys of aluminum containing between about 0 to 2.0% Si and between about 0 to 1.0% Cu. As commonly practiced in the industry, the aluminum or aluminum alloy metallization layer, 16, is deposited by a two step sputtering process wherein the first step is performed cold to insure continuity of film coverage and the second step is performed hot to fill and planarize the contact region. For example, the cold sputter deposition should be at a substrate temperature between about 25° to 150° C., and preferably at a temperature less than about 100° C., and should deposit a layer thickness between about 1,000 to 3,500 Angstroms. The hot sputter deposition should immediately follow and should be at a substrate temperature between about 400° to 580° C., and preferably at a temperature higher than 430° C., and should deposit a layer thickness between about 2,500 to 7,500 Angstroms. A final sputtered titanium nitride cap layer, 17, is deposited to serve as an ARC (Anti-Reflection Coating) layer, as commonly used to facilitate photolithogrphic processing for patterning of the interconnect metallization layer. FIG. 2 shows a completed metallization contact to silicon and interconnect metal after pattern formation.

While the invention has been particularly shown and described with reference to the preferred embodiments thereof, it will be understood by those skilled in the art that various changes in form and details may be made without departing from the spirit and scope of the invention.

What is claimed is:

1. A method for fabricating a MOSFET device on a semiconductor substrate, wherein contact to the active device element comprises the steps of:

providing said active device element in said semiconductor substrate;

depositing an interlevel dielectric layer on said semiconductor substrate, that includes said active device element;

providing a contact opening, etched through said interlevel dielectric layer, to said active device element;

depositing a first titanium layer over the surface of said interlevel dielectric layer and into said contact opening;

depositing a titanium nitride layer over said first titanium layer;

depositing a conformal CVD tungsten layer over said titanium nitride layer;

depositing a second titanium layer over said conformal CVD tungsten layer;

cold sputtering an aluminum layer over said second titanium layer at a temperature of less than about 100° C.; and hot sputtering an aluminum layer over said cold sputtered aluminum layer at a temperature of more than about 430° C.

2. The method of claim 1, wherein said active device element in said semiconductor substrate, is an N-type doped region.

3. The method of claim 1, wherein said interlevel dielectric layer is silicon oxide, deposited using LPCVD, APCVD or PECVD processes, at a temperature between about 400° to 850° C., to a thickness between about 5,000 to 15,000 Angstroms.

4. The method of claim 1, wherein said contact opening is created using anisotropic RIE removal of said interlevel dielectric, in $O_2$, $CHF_3$, $CF_4$, CO or $C_4F_8$ chemistry.

5. The method of claim 1, wherein said first titanium layer, having a thickness between about 400 to 800 Angstroms, is deposited by sputtering.

6. The method of claim 1, wherein said titanium nitride layer, having a thickness between about 800 to 1,500 Angstroms, is deposited by sputtering.

7. The method of claim 1, wherein said conformal CVD tungsten layer is deposited at a temperature between about 350° to 480° C., to a thickness between about 800 to 2,500 Angstroms, using $WF_6$, $SiH_4$ and $H_2$ at a pressure between about 60 to 120 Torr.

8. The method of claim 1, wherein said second titanium layer, having a thickness between about 400 to 800 Angstroms, is deposited by sputtering.

9. The method of claim 1, wherein said cold sputtering of said aluminum layer is performed at a temperature between about 25° to 150° C.

10. The method of claim 1, wherein said hot sputtering of said aluminum layer is performed at a temperature between about 400° to 580° C.

11. The method of claim 9, wherein said cold sputtered aluminum layer is deposited to a thickness between about 1,500 to 3,500 Angstroms.

12. The method of claim 10, wherein said hot sputtered aluminum layer is deposited to a thickness between about 2,500 to 7,500 Angstroms.

* * * * *